US011699001B2

(12) United States Patent
Palmer et al.

(10) Patent No.: US 11,699,001 B2
(45) Date of Patent: Jul. 11, 2023

(54) GENERATING MEASUREMENTS OF PHYSICAL STRUCTURES AND ENVIRONMENTS THROUGH AUTOMATED ANALYSIS OF SENSOR DATA

(71) Applicant: Flyreel, Inc., Denver, CO (US)

(72) Inventors: Victor Palmer, College Station, TX (US); Vu Tran, Garden Grove, CA (US); Brian Webb, Bellingham, WA (US); Brian Keller, Columbia, MD (US)

(73) Assignee: Flyreel, Inc., Denver, CO (US)

( * ) Notice: Subject to any disclaimer, the term of this patent is extended or adjusted under 35 U.S.C. 154(b) by 0 days.

(21) Appl. No.: 17/500,128

(22) Filed: Oct. 13, 2021

(65) Prior Publication Data

US 2022/0114298 A1 Apr. 14, 2022

Related U.S. Application Data

(60) Provisional application No. 63/091,149, filed on Oct. 13, 2020.

(51) Int. Cl.
*G06F 30/13* (2020.01)
*G06F 30/27* (2020.01)
(Continued)

(52) U.S. Cl.
CPC .............. *G06F 30/13* (2020.01); *G01P 13/00* (2013.01); *G06F 30/27* (2020.01); *G06T 11/203* (2013.01);
(Continued)

(58) Field of Classification Search
CPC .......... G06F 30/13; G06F 30/27; G01P 13/00; G06T 11/203; G06T 2210/04; G06T 2210/12; H04N 5/23238; H04N 5/23293
See application file for complete search history.

(56) References Cited

U.S. PATENT DOCUMENTS 6,657,667 B1 * 12/2003 Anderson .............. H04N 5/262
348/333.12
8,217,956 B1 * 7/2012 Jin .......................... G06T 15/10
345/585
(Continued)

OTHER PUBLICATIONS

H. Kim, T. De Campos and A. Hilton, "Room Layout Estimation with Object and Material Attributes Information Using a Spherical Camera," 2016 Fourth International Conference on 3D Vision (3DV), 2016, pp. 519-527, doi: 10.1109/3DV.2016.83. (Year: 2016).*

(Continued)

*Primary Examiner* — Charles L Beard
(74) *Attorney, Agent, or Firm* — Troutman Pepper Hamilton Sanders LLP; James E. Schutz; Mark Lehi Jones

(57) ABSTRACT

Introduced here computer programs and associated computer-implemented techniques for generating measurements of physical structures and environments in an automated matter through analysis of data that is generated by one or more sensors included in a computing device. This can be accomplished by combining insights that are derived through analysis different types of data that are generated, computed, or otherwise obtained by a computing device. For instance, a computer program may enable or facilitate measurement of arbitrary dimensions, angles, and square footage of a physical structure based on (i) images generated by an image sensor included in the corresponding computing device and (ii) measurements generated by an inertial sensor included in the corresponding computing device.

17 Claims, 9 Drawing Sheets
(1 of 9 Drawing Sheet(s) Filed in Color)

(51) Int. Cl.
   *G01P 13/00*    (2006.01)
   *G06T 11/20*    (2006.01)
   *H04N 23/63*    (2023.01)
   *H04N 23/698*   (2023.01)

(52) U.S. Cl.
   CPC .......... *H04N 23/63* (2023.01); *H04N 23/698* (2023.01); *G06T 2210/04* (2013.01); *G06T 2210/12* (2013.01)

(56) References Cited

U.S. PATENT DOCUMENTS

| | | | | |
|---|---|---|---|---|
| 8,570,329 | B1* | 10/2013 | Ofstad | G06F 3/04842 345/473 |
| 9,521,321 | B1* | 12/2016 | Kozko | H04N 23/698 |
| 10,021,295 | B1* | 7/2018 | Baldwin | H04N 23/698 |
| 10,033,928 | B1* | 7/2018 | Meier | H04N 25/41 |
| 10,133,933 | B1* | 11/2018 | Fisher | G06V 20/41 |
| 10,319,150 | B1* | 6/2019 | Canada | G06T 19/006 |
| 10,321,109 | B1* | 6/2019 | Tanumihardja | H04N 9/641 |
| 10,395,147 | B2* | 8/2019 | Stenger | G06V 30/274 |
| 10,410,350 | B2* | 9/2019 | Xu | G06K 9/66 |
| 10,554,896 | B2* | 2/2020 | Birkler | H04N 23/66 |
| 10,607,405 | B2* | 3/2020 | Tung | G06T 19/20 |
| 10,621,747 | B2* | 4/2020 | Malisiewicz | G06K 9/6271 |
| 10,708,507 | B1* | 7/2020 | Dawson | H04N 23/633 |
| 10,825,247 | B1* | 11/2020 | Vincent | G06T 17/05 |
| 10,832,437 | B2* | 11/2020 | Stenger | G06T 7/70 |
| 10,839,606 | B2* | 11/2020 | Lin | G06T 7/12 |
| 10,937,211 | B2* | 3/2021 | Bergin | G06F 30/13 |
| 10,991,161 | B2* | 4/2021 | Sinclair | G06T 17/205 |
| 11,006,041 | B1* | 5/2021 | Ma | H04N 23/698 |
| 11,043,026 | B1* | 6/2021 | Fathi | G06N 20/00 |
| 11,094,135 | B1* | 8/2021 | Palmer | G06T 19/006 |
| 11,200,734 | B2* | 12/2021 | Huang | G06T 17/00 |
| 11,210,854 | B2* | 12/2021 | Barnett | G06Q 30/0277 |
| 11,252,329 | B1* | 2/2022 | Cier | H04N 23/53 |
| 11,282,268 | B1* | 3/2022 | Palmer | G06T 7/12 |
| 11,410,362 | B1* | 8/2022 | Soltani | G06T 11/203 |
| 11,494,857 | B2* | 11/2022 | Winans | G06V 20/64 |
| 2007/0030341 | A1* | 2/2007 | Morimoto | H04N 23/633 348/207.99 |
| 2007/0081081 | A1* | 4/2007 | Cheng | G06T 3/4038 386/E5.072 |
| 2009/0147071 | A1* | 6/2009 | Jones | G08B 13/19693 348/311 |
| 2010/0054628 | A1* | 3/2010 | Levy | G06T 3/4038 382/284 |
| 2011/0181687 | A1* | 7/2011 | Yoshizumi | H04N 23/698 348/36 |
| 2011/0181690 | A1* | 7/2011 | Yoshizumi | H04N 23/51 348/37 |
| 2012/0154442 | A1* | 6/2012 | Takaoka | H04N 23/60 345/634 |
| 2013/0155058 | A1* | 6/2013 | Golparvar-Fard | G06Q 10/06311 345/419 |
| 2013/0156297 | A1* | 6/2013 | Shotton | G06F 18/28 382/159 |
| 2013/0226515 | A1* | 8/2013 | Pershing | G06Q 50/16 702/156 |
| 2014/0132788 | A1* | 5/2014 | Ramsay | H04N 23/698 348/218.1 |
| 2014/0160234 | A1* | 6/2014 | Okuda | H04N 23/66 348/36 |
| 2014/0333615 | A1* | 11/2014 | Ramalingam | G06T 17/00 345/420 |
| 2014/0362176 | A1* | 12/2014 | St. Clair | H04N 23/698 348/36 |
| 2015/0207988 | A1* | 7/2015 | Tracey | H04N 23/698 348/36 |
| 2015/0304576 | A1* | 10/2015 | Horak | H04N 23/80 348/37 |
| 2015/0304652 | A1* | 10/2015 | Spas | H04N 23/68 348/36 |
| 2015/0312478 | A1* | 10/2015 | Barcovschi | H04N 23/635 348/36 |
| 2015/0373266 | A1* | 12/2015 | Hsieh | H04N 23/698 348/36 |
| 2016/0005211 | A1* | 1/2016 | Sarkis | G06T 1/0007 345/419 |
| 2016/0086379 | A1* | 3/2016 | Sadi | G02B 27/0093 345/633 |
| 2016/0088287 | A1* | 3/2016 | Sadi | H04N 23/80 348/43 |
| 2016/0104510 | A1* | 4/2016 | Tamir | H04N 23/661 386/223 |
| 2016/0217225 | A1* | 7/2016 | Bell | G06F 30/13 |
| 2016/0360104 | A1* | 12/2016 | Zhang | G06T 15/205 |
| 2017/0132835 | A1* | 5/2017 | Halliday | G06T 15/04 |
| 2017/0169620 | A1* | 6/2017 | Bleiweiss | G06T 3/20 |
| 2017/0180680 | A1* | 6/2017 | Yu | H04N 23/661 |
| 2017/0278308 | A1* | 9/2017 | Bleiweiss | G06F 18/2413 |
| 2017/0352191 | A1* | 12/2017 | Zhou | H04N 21/21805 |
| 2018/0027178 | A1* | 1/2018 | Macmillan | G06T 3/20 348/38 |
| 2018/0089763 | A1* | 3/2018 | Okazaki | G06T 11/60 |
| 2018/0122042 | A1* | 5/2018 | Kim | G06F 3/011 |
| 2018/0137642 | A1* | 5/2018 | Malisiewicz | G06N 3/084 |
| 2018/0139431 | A1* | 5/2018 | Simek | H04N 13/254 |
| 2018/0143756 | A1* | 5/2018 | Mildrew | G06T 17/05 |
| 2018/0144555 | A1* | 5/2018 | Ford | G06T 15/20 |
| 2018/0190033 | A1* | 7/2018 | Barnett | G06T 7/70 |
| 2018/0225393 | A1* | 8/2018 | Jovanovic | G06T 15/10 |
| 2018/0225870 | A1* | 8/2018 | Upendran | G06T 7/60 |
| 2018/0232471 | A1* | 8/2018 | Schissler | G06V 10/82 |
| 2018/0247132 | A1* | 8/2018 | Liu | G06T 11/60 |
| 2018/0262683 | A1* | 9/2018 | Meier | G06T 7/13 |
| 2018/0268220 | A1* | 9/2018 | Lee | G06V 10/454 |
| 2018/0302614 | A1* | 10/2018 | Toksvig | H04N 23/90 |
| 2018/0315162 | A1* | 11/2018 | Sturm | G06T 3/0037 |
| 2018/0332205 | A1* | 11/2018 | Hawthorne | H04N 13/257 |
| 2018/0338084 | A1* | 11/2018 | Edpalm | H04N 23/698 |
| 2018/0374192 | A1* | 12/2018 | Kunkel | H04N 23/58 |
| 2019/0007590 | A1* | 1/2019 | Lee | H04N 13/128 |
| 2019/0020817 | A1* | 1/2019 | Shan | H04N 23/63 |
| 2019/0026956 | A1* | 1/2019 | Gausebeck | G06T 7/593 |
| 2019/0026958 | A1* | 1/2019 | Gausebeck | H04N 13/10 |
| 2019/0035165 | A1 | 1/2019 | Gausebeck | |
| 2019/0051054 | A1* | 2/2019 | Jovanovic | G06T 17/00 |
| 2019/0058811 | A1* | 2/2019 | Douady-Pleven | H04N 1/3876 |
| 2019/0124749 | A1* | 4/2019 | Deixler | H04N 23/698 |
| 2019/0205485 | A1* | 7/2019 | Rejeb Sfar | G06T 17/00 |
| 2019/0251352 | A1* | 8/2019 | Hovden | G06T 3/0081 |
| 2019/0266293 | A1* | 8/2019 | Ishida | G06T 7/60 |
| 2019/0266793 | A1* | 8/2019 | Sheffield | G06F 30/13 |
| 2019/0303512 | A1* | 10/2019 | Davies | G06N 20/10 |
| 2019/0318538 | A1* | 10/2019 | Li | G06T 19/20 |
| 2019/0325628 | A1* | 10/2019 | Dubey | G06N 3/006 |
| 2019/0332866 | A1* | 10/2019 | Beall | H04N 21/816 |
| 2019/0335120 | A1* | 10/2019 | Suzuki | H04N 23/667 |
| 2019/0340814 | A1* | 11/2019 | Sinclair | G06T 17/20 |
| 2019/0340835 | A1* | 11/2019 | Sinclair | G06T 19/20 |
| 2019/0349598 | A1* | 11/2019 | Aminlou | H04N 19/105 |
| 2019/0379856 | A1* | 12/2019 | Hur | H04N 5/2624 |
| 2019/0385363 | A1* | 12/2019 | Porter | G06T 7/564 |
| 2019/0387165 | A1* | 12/2019 | Lee | H04N 13/204 |
| 2019/0392630 | A1* | 12/2019 | Sturm | G06T 7/593 |
| 2020/0005428 | A1* | 1/2020 | Sedeffow | G06T 3/00 |
| 2020/0007841 | A1* | 1/2020 | Sedeffow | G06T 3/0031 |
| 2020/0008024 | A1* | 1/2020 | Hu | G06T 19/00 |
| 2020/0036955 | A1* | 1/2020 | Pesonen | H04N 13/15 |
| 2020/0043186 | A1* | 2/2020 | Selviah | G06T 7/33 |
| 2020/0051338 | A1* | 2/2020 | Zia | G06F 9/451 |
| 2020/0057824 | A1* | 2/2020 | Yeh | G06F 30/13 |
| 2020/0074739 | A1* | 3/2020 | Stauber | G06F 3/011 |
| 2020/0090417 | A1* | 3/2020 | Schloter | G06T 7/33 |
| 2020/0116493 | A1* | 4/2020 | Colburn | G06F 18/253 |
| 2020/0175753 | A1* | 6/2020 | Bae | G06T 11/203 |
| 2020/0177780 | A1* | 6/2020 | Meier | G06T 3/0018 |
| 2020/0211284 | A1* | 7/2020 | Lin | G06T 17/00 |

(56) References Cited

U.S. PATENT DOCUMENTS

| | | | | |
|---|---|---|---|---|
| 2020/0258144 A1* | 8/2020 | Chaturvedi | | G06T 7/50 |
| 2020/0296350 A1* | 9/2020 | Oh | | H04N 13/161 |
| 2020/0302681 A1* | 9/2020 | Totty | | G06T 7/74 |
| 2020/0302686 A1* | 9/2020 | Totty | | G06T 7/50 |
| 2020/0311468 A1* | 10/2020 | Kim | | G06N 3/08 |
| 2020/0312013 A1* | 10/2020 | Dougherty | | G06Q 50/16 |
| 2020/0327262 A1* | 10/2020 | Cramer | | G06F 30/13 |
| 2020/0334833 A1* | 10/2020 | Gibbon | | H04N 23/90 |
| 2020/0387788 A1* | 12/2020 | Alves | | G06F 16/93 |
| 2020/0394849 A1* | 12/2020 | Barker | | G06T 7/40 |
| 2021/0004190 A1* | 1/2021 | Schapiro | | H04N 23/695 |
| 2021/0004933 A1* | 1/2021 | Wong | | G06T 7/248 |
| 2021/0019453 A1* | 1/2021 | Yang | | G06T 19/20 |
| 2021/0058731 A1* | 2/2021 | Koike | | G06F 18/22 |
| 2021/0064216 A1* | 3/2021 | Li | | G06F 3/04815 |
| 2021/0073430 A1* | 3/2021 | Levy | | G06F 30/27 |
| 2021/0073449 A1* | 3/2021 | Segev | | G06Q 10/0875 |
| 2021/0104093 A1* | 4/2021 | Vincent | | G06F 30/13 |
| 2021/0117582 A1* | 4/2021 | Kamenca | | G06F 30/13 |
| 2021/0117583 A1* | 4/2021 | Strong | | G06T 7/10 |
| 2021/0118165 A1* | 4/2021 | Strong | | G06T 7/11 |
| 2021/0125397 A1* | 4/2021 | Moulon | | G06T 17/00 |
| 2021/0127060 A1* | 4/2021 | Ji | | G06Q 50/16 |
| 2021/0150088 A1* | 5/2021 | Gallo | | G06F 30/13 |
| 2021/0150805 A1* | 5/2021 | Stekovic | | G06T 7/11 |
| 2021/0176388 A1* | 6/2021 | Douady-Pleven | | H04N 23/70 |
| 2021/0183128 A1* | 6/2021 | Miller | | G06F 16/50 |
| 2021/0192748 A1* | 6/2021 | Morales Morales | | G06N 3/044 |
| 2021/0199809 A1* | 7/2021 | Wynn | | G03B 37/00 |
| 2021/0225090 A1* | 7/2021 | Tang | | G06F 18/24 |
| 2021/0256177 A1* | 8/2021 | Voss | | G06T 7/11 |
| 2021/0272308 A1* | 9/2021 | Dinh | | G06N 3/045 |
| 2021/0272358 A1* | 9/2021 | Stevens | | G06T 7/10 |
| 2021/0279950 A1* | 9/2021 | Phalak | | G06F 18/23 |
| 2021/0303757 A1* | 9/2021 | Pandey | | G06F 30/398 |
| 2021/0312203 A1* | 10/2021 | Patzwaldt | | G06V 20/56 |
| 2021/0312702 A1* | 10/2021 | Holzer | | H04N 23/64 |
| 2021/0321035 A1* | 10/2021 | Sherrah | | G06V 40/10 |
| 2021/0326026 A1* | 10/2021 | Osipov | | G06T 19/00 |
| 2021/0335052 A1* | 10/2021 | Jeong | | H04N 13/117 |
| 2021/0343073 A1* | 11/2021 | Carrington | | G06V 10/44 |
| 2021/0352222 A1* | 11/2021 | Zavesky | | G06T 5/50 |
| 2021/0375062 A1* | 12/2021 | Fleischman | | G06T 7/70 |
| 2021/0383115 A1* | 12/2021 | Alon | | G06V 10/764 |
| 2021/0383501 A1* | 12/2021 | Edpalm | | H04N 23/45 |
| 2021/0385378 A1* | 12/2021 | Cier | | G06T 3/4038 |
| 2022/0003555 A1* | 1/2022 | Colburn | | G05D 1/0274 |
| 2022/0076019 A1* | 3/2022 | Moulon | | G05D 1/0219 |
| 2022/0092227 A1* | 3/2022 | Yin | | G06T 17/00 |
| 2022/0108044 A1* | 4/2022 | Kalmbach | | G06V 10/44 |
| 2022/0114291 A1* | 4/2022 | Li | | G06T 19/00 |
| 2022/0124298 A1* | 4/2022 | Chen | | G06T 3/4038 |
| 2022/0147662 A1* | 5/2022 | Halliday | | G06F 3/14 |
| 2022/0156426 A1* | 5/2022 | Hampali | | G06V 10/764 |
| 2022/0164493 A1* | 5/2022 | Li | | G06V 10/7715 |
| 2022/0180595 A1* | 6/2022 | Bethi | | G06T 15/005 |
| 2022/0189122 A1* | 6/2022 | Li | | G06T 19/006 |
| 2022/0198709 A1* | 6/2022 | Sudry | | G06Q 50/08 |
| 2022/0224833 A1* | 7/2022 | Cier | | H04N 23/698 |
| 2022/0256076 A1* | 8/2022 | Douady | | H04N 19/85 |
| 2022/0269885 A1* | 8/2022 | Wixson | | G06V 10/82 |
| 2022/0269888 A1* | 8/2022 | Stoeva | | G06V 10/255 |
| 2022/0284146 A1* | 9/2022 | Tran | | G06N 3/047 |
| 2022/0292289 A1* | 9/2022 | Shalumov | | G06T 5/002 |
| 2022/0292421 A1* | 9/2022 | Murphy | | G06Q 10/06312 |
| 2022/0300669 A1* | 9/2022 | Song | | G06T 19/20 |
| 2022/0375170 A1* | 11/2022 | Osokin | | G06T 17/20 |
| 2022/0391627 A1* | 12/2022 | Powles | | G06Q 10/103 |
| 2022/0406007 A1* | 12/2022 | Ton-That | | G06N 5/04 |
| 2023/0035601 A1* | 2/2023 | Alimo | | G01S 17/89 |
| 2023/0051749 A1* | 2/2023 | Li | | G06T 11/00 |

OTHER PUBLICATIONS

International Search Report and Written Opinion for International Application No. PCT/US2021/054796; dated Jan. 21, 2022; 8 pages.

* cited by examiner

500

501

Receive input that is indicative of a request to establish the layout of an interior space that includes a series of junctures, each of which represents a point at which a different pair of surfaces are joined

502

Instruct a user to generate a panorama by panning a computing device while an image sensor generates images of the interior space

503

Apply a trained model to the panorama to produce an output that is representative of a juncture predicted by the trained model based on an analysis of the panorama

504

Cause display of at least a portion of the panorama with a graphical element overlaid thereon to indicate a location of the juncture predicted by the trained model

505

Establish the layout of the interior space based on outputs produced by the trained model

506

Encode information regarding the layout in a data structure that is associated with the interior space

507

Cause transmission of the data structure to a destination external to the computing device

GENERATING MEASUREMENTS OF PHYSICAL STRUCTURES AND ENVIRONMENTS THROUGH AUTOMATED ANALYSIS OF SENSOR DATA

CROSS-REFERENCE TO RELATED APPLICATIONS

This application claims priority to U.S. Provisional Application No. 63/091,149, titled "System and Method for Generating Automated Structural Measurements" and filed on Oct. 13, 2020, which is incorporated by reference herein in its entirety.

TECHNICAL FIELD

Various embodiments concern computer programs and associated computer-implemented techniques for generating measurements of physical structures and environments in an automated matter.

BACKGROUND

Conventionally, dimensions of physical structures and environments have been measured using implements such as tape measures, yard sticks, rulers, and the like. These implements are useful for measuring the linear distance between a first location and a second location in Euclidean space (e.g., along a plane) along a straight line. There are several notable downsides to using these implements, however. Measuring not only tends to be inconsistent due to the reliance on the person(s) using the implement, but can also be difficult when portions of the physical structure or environment being measured are occluded or occupied.

There have been several attempts to address these downsides through the development of computer programs that can be executed by mobile computing devices (or simply "computing devices"). One attempt involved the development of a computer program that prompted the user to orient the camera of a computing device toward an object to be measured and then requested that the user interact with a digital image generated by the camera so as to indicate the bounds of the object. Another approach involved the development of a computer program that prompted the user to orient the camera of a computing device toward an object to be measured and then requested that the user provide a reference measurement for another object contained in a digital image generated by the camera.

Computer programs such as these are much more convenient than conventional implements as they are readily downloadable by anyone with a computing device. However, there still tends to be a large amount of inconsistency that results in incorrect measurements. Much of this inconsistency is due to the degree to which users are still involved in the measurement process. For example, a user may imprecisely indicate the bounds of an object to be measured, or a user may input an incorrect reference measurement by mistake.

BRIEF DESCRIPTION OF THE DRAWINGS

This patent or application publication contains at least one drawing executed in color. Copies of this patent or application publication with color drawings will be provided by the Office upon request and payment of the necessary fee.

FIG. 5 includes a flow diagram of a process for facilitating a guided procedure for modeling an interior space of a structure using an inspection platform that is executing on a computing device.

Figure 1:
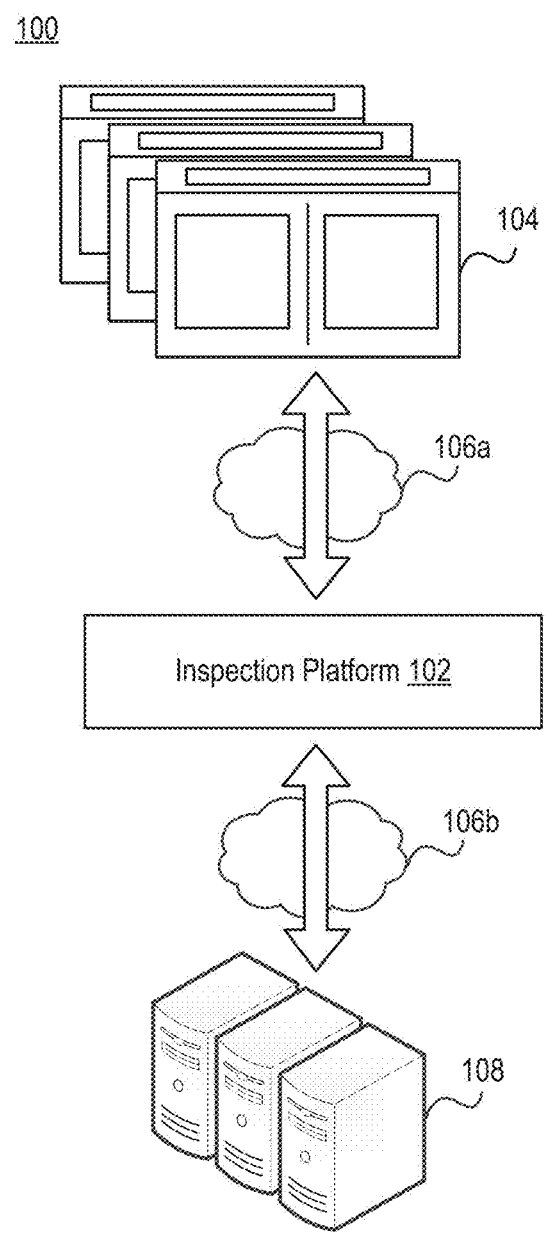
FIG. 1 illustrates a network environment that includes an inspection platform.

Various features of the technology described herein will become more apparent to those skilled in the art from a study of the Detailed Description in conjunction with the drawings. Various embodiments are depicted in the drawings for the purpose of illustration. However, those skilled in the art will recognize that alternative embodiments may be employed without departing from the principles of the technology. Accordingly, although specific embodiments are shown in the drawings, the technology is amenable to various modifications.

DETAILED DESCRIPTION

Introduced here are computer programs that are able to generate measurements of physical structures and environments in an automated matter through analysis of data that is generated by one or more sensors included in a computing device. As further discussed below, these computer programs may be able to accomplish this by combining insights that are derived through analysis different types of data that are generated, computed, or otherwise obtained by a computing device. For instance, a computer program may enable or facilitate measurement of arbitrary dimensions, angles, and square footage of a physical structure (or simply "structure") based on (i) images generated by an image sensor included in the corresponding computing device and (ii) measurements generated by an inertial sensor (also referred to as a "motion sensor") included in the corresponding computing device. This approach is advantageous since the images provide a visual representation of the structure up to an unknown scale factor, while the inertial measurements (also referred to as "motion measurements") provide an estimate of the unknown scale factor. Together, these data enable estimates of absolute measurements on the structure.

For the purpose of illustration, embodiments may be described in the context of generating measurements of a structure in an automated manner. As an example, a computer program may be designed to establish the height, width, and depth of the structure so as to establish its dimensions. However, those skilled in the art will recognize that features of those embodiments may be similarly applicable to generating measurements of a physical environment (or simply "environment").

Accordingly, the computer programs described herein may be able to generate measurements of interior spaces of structures, exterior spaces of structures, or salient objects present therein. The term "interior space" may refer to a three-dimensional (3D) space that is enclosed by a floor, ceiling, and walls. The term "interior space" may be used interchangeably with the term "room." Note that an interior space need not be completely bounded by walls on all sides, as the teachings of the present disclosure can be applied to interior spaces that are partially or fully enclosed by walls. Meanwhile, the term "exterior space" may be a space that is external to a structure of interest. Examples of exterior spaces include driveways, decks, and the like.

As an example, assume that a computer program executing in a computing device receives input that is representative of a request to measure a structure. Normally, this input will correspond to a user either initiating (i.e., opening) the computer program or interacting with the computer program in such a manner so as to indicate that she is interested in measuring the structure.

Thereafter, the computer program may instruct the user to situate the computing device in a predetermined orientation with respect to the structure. For example, the user may be instructed to situate the computing device so that image data generated by an image sensor contained therein is captured in a horizontal orientation relative to the structure. As part of a measurement operation, the computer program may cause the image sensor to generate image data that corresponds to at least a portion of the structure. Generally, the image data is representative of a series of digital images (or simply "images") that are generated by the image sensor in succession. As part of the measurement operation, the computer program may also obtain inertial measurement data (also referred to as "IMU data" or "inertial data") that is representative of measurements generated by one or more motion sensors contained in the computing device. The inertial data may be temporally aligned with the image data. Thus, the inertial data may be generated by the motion sensor(s) contemporaneously with the image data generated by the image sensor.

The computer program can then generate an image of the structure based on the image data and inertial data. For example, the computer program may programmatically combine the image data and inertial data so as to create a panorama image (or simply "panorama") having an equirectangular projection by estimating, based on the image data, the focal lengths needed to generate the equirectangular panorama and then determining, based on the inertial data, an approximate location of each image included in the image data relative to the geography of the structure.

The computer program can then determine the locations of physical features, such as junctures, based on an analysis of the equirectangular panorama that includes at least a portion of the structure. The term "juncture" may refer to any location where a pair of walls join, intersect, or otherwise merge or converge with one another. Note that the term "juncture" is intended to cover corners where the walls form acute, obtuse, or reflex angles, so the teachings of the present disclosure are applicable to structures regardless of their particular configuration. Moreover, the computer program may identify the boundaries of objects that are present in the equirectangular panorama. For example, the computer program may estimate the dimensions of objects to a scale factor such that final measurements are regressed relative to the distance between the computing device and ground.

Over the course of the measurement operation, relevant information may be posted to an interface that is presented by the computing device for consideration by the user. As an example, a manipulable two-dimensional (2D) or 3D image may be posted to the interface and then updated in near real time as the computer program generates measurements for the structure and objects present therein. This manipulable image may also be useful in identifying which portions of the structure have not yet been imaged.

At a high level, the present disclosure covers two actions that can be performed in sequence as part of a measurement operation. First, a panorama is created of structure. Second, information regarding the structure—like its dimensions—is determined or inferred through analysis of the panorama. The first action could be performed in a roughly similar manner regardless of the nature of the structure (e.g., whether an interior space or exterior space is being imaged). The second action may depend on the nature of the structure, however. If the structure is an interior space, for example, there may be several assumptions (e.g., fixed ceiling height, bounded by junctures, etc.) that may not be applicable to exterior spaces. Accordingly, how the panorama is analyzed may depend on the nature of the structure being imaged.

Embodiments may be described in the context of executable instructions for the purpose of illustration. However, those skilled in the art will recognize that aspects of the technology could be implemented via hardware, firmware, or software. As an example, a computer program that is representative of a software-implemented inspection platform (or simply "inspection platform") designed to facilitate measuring of the interior spaces or exterior spaces of structures may be executed by the processor of a computing device. This computer program may interface, directly or indirectly, with hardware, firmware, or other software implemented on the computing device. For instance, this computer program may interact with an image sensor that is able to generate image data from which a panorama can be constructed, a motion sensor that generates measurements indicative of motion of the computing device, etc.

Terminology

References in the present disclosure to "an embodiment" or "some embodiments" mean that the feature, function, structure, or characteristic being described is included in at least one embodiment. Occurrences of such phrases do not necessarily refer to the same embodiment, nor are they necessarily referring to alternative embodiments that are mutually exclusive of one another.

The term "based on" is to be construed in an inclusive sense rather than an exclusive sense. That is, in the sense of "including but not limited to." Thus, unless otherwise noted, the term "based on" is intended to mean "based at least in part on."

The terms "connected," "coupled," and variants thereof are intended to include any connection or coupling between two or more elements, either direct or indirect. The connection or coupling can be physical, logical, or a combination thereof. For example, elements may be electrically or communicatively coupled to one another despite not sharing a physical connection.

The term "module" may refer broadly to software, firmware, hardware, or combinations thereof. Modules are typically functional components that generate one or more outputs based on one or more inputs. A computer program may include or utilize one or more modules. For example, a computer program may utilize multiple modules that are responsible for completing different tasks, or a computer program may utilize a single module that is responsible for completing all tasks.

When used in reference to a list of multiple items, the word "or" is intended to cover all of the following interpretations: any of the items in the list, all of the items in the list, and any combination of items in the list.

Overview of Inspection Platform

FIG. 1 illustrates a network environment 100 that includes an inspection platform 102. Individuals (also referred to as "users") can interface with the inspection platform 102 via interfaces 104. For example, a user may be able to access an interface through which information regarding a structure can be input. For instance, the user may specify the same of an interior space whose dimensions are to be measured, or the user may provide information regarding the property (e.g., an address, number of occupants, construction materials, insurance provider) or its owner (e.g., name, insurance account number). As another example, a user may be able to access an interface through which feedback is provided as images (e.g., panoramas) of a structure are generated. These interfaces 104 may also permit users to view 2D and 3D representations of structures, as well as manage preferences. The term "user," as used herein, may refer to a homeowner, business owner, assessor insurance adjuster (also referred to as a "claims adjuster"), or another individual with an interest in generating measurements for a structure.

As shown in FIG. 1, the inspection platform 102 may reside in a network environment 100. Thus, the computing device on which the inspection platform 102 is implemented may be connected to one or more networks 106a-b. These networks 106a-b may be personal area networks (PANs), local area networks (LANs), wide area networks (WANs), metropolitan area networks (MANs), cellular networks, or the Internet. Additionally or alternatively, the inspection platform 102 can be communicatively coupled to one or more computing devices over a short-range wireless connectivity technology, such as Bluetooth®, Near Field Communication (NFC), Wi-Fi® Direct (also referred to as "Wi-Fi P2P"), and the like.

The interfaces 104 may be accessible via a web browser, desktop application, mobile application, or over-the-top (OTT) application. For example, in order to complete the measurement operation further described below, a user may access an interface that is generated by a mobile application executing on a mobile phone. This interface may also be accessible via the web browser executing on the mobile phone. Accordingly, the interfaces 104 may be viewed on a mobile phone, a tablet computer, a wearable electronic device (e.g., a watch or fitness accessory), or a virtual or augmented reality system (e.g., a head-mounted display).

In some embodiments, at least some components of the inspection platform 102 are hosted locally. That is, part of the inspection platform 102 may reside on the computing device that is used to access the interfaces 104. For example, the inspection platform 102 may be embodied as a mobile application that is executable by a mobile phone. Note, however, that the mobile application may be communicatively connected to a server system 108 on which other components of the inspection platform 102 are hosted.

In other embodiments, the inspection platform 102 is executed entirely by a cloud computing service operated by, for example, Amazon Web Services®, Google Cloud Platform™, or Microsoft Azure®. In such embodiments, the inspection platform 102 may reside on a server system 108 that is comprised of one or more computer servers. These computer server(s) can include different types of data (e.g., spatial coordinates for junctures, dimensions, images), algorithms for processing the data, structure information (e.g., address, construction date, construction material, insurance provider), and other assets. Those skilled in the art will recognize that this information could also be distributed amongst the server system 108 and one or more computing devices. For example, some data that is generated by the computing device on which the inspection platform 102 resides may be stored on, and processed by, that computing device for security or privacy purposes.

Figure 2:
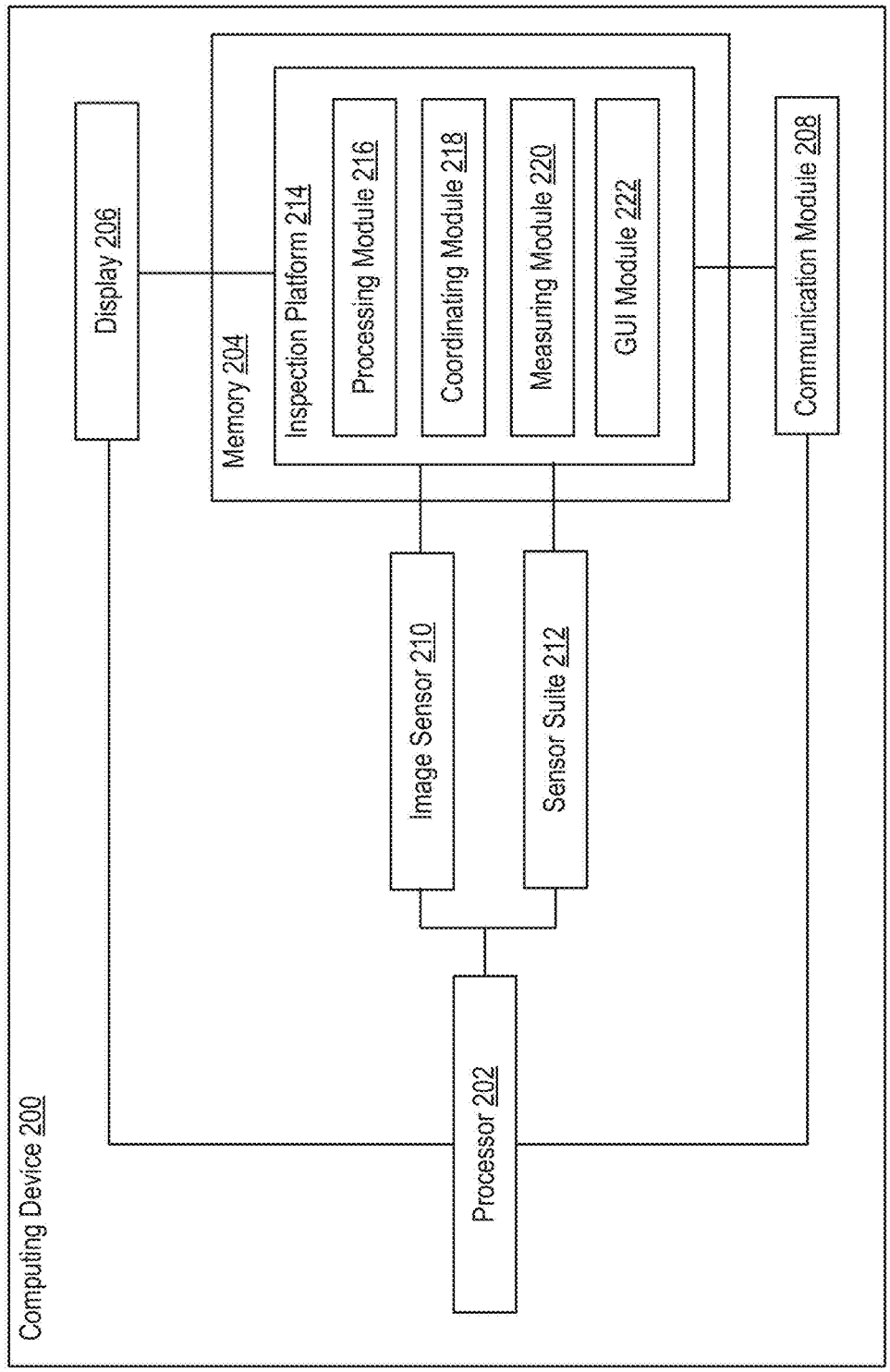
FIG. 2 illustrates an example of a computing device that is able to implement an inspection platform designed to establish the layout of a physical space associated with a structure.

FIG. 2 illustrates an example of a computing device 200 that is able to implement an inspection platform 214 designed to establish the layout of a physical space associated with a structure. This physical space could be an interior space or exterior space. The inspection platform 214 can establish the layout based on an analysis of image(s) of the physical space. As further discussed below, these image(s) can be acquired during a guided measurement operation in which a user is prompted to pan the computing device 200 to capture a panorama of the physical space. The term "panorama" may be used to refer to an image that represents a wide view of the physical space. Normally, panoramas offer an unbroken view of at least a 180 degree field of view (FOV) along the horizontal plane, though panoramas could offer an unbroken view of a 360 degree FOV along the horizontal plane. Through analysis of a panorama, the inspection platform 214 may be able to determine locations of junctures that correspond to the periphery of the physical space and then infer its dimensions (and thus, its layout) based on those locations.

The computing device 200 can include a processor 202, memory 204, display 206, communication module 208, image sensor 210, and sensor suite 212. Each of these components is discussed in greater detail below. Those skilled in the art will recognize that different combinations of these components may be present depending on the nature of the computing device 200.

The processor 202 can have generic characteristics similar to general-purpose processors, or the processor 202 may be an application-specific integrated circuit (ASIC) that provides control functions to the computing device 200. As shown in FIG. 2, the processor 202 can be coupled to all components of the computing device 200, either directly or indirectly, for communication purposes.

The memory 204 may be comprised of any suitable type of storage medium, such as static random-access memory (SRAM), dynamic random-access memory (DRAM), electrically erasable programmable read-only memory (EEPROM), flash memory, or registers. In addition to storing instructions that can be executed by the processor 202, the memory 204 can also store data generated by the processor 202 (e.g., when executing the modules of the inspection platform 214). Note that the memory 204 is merely an abstract representation of a storage environment. The memory 204 could be comprised of actual memory chips or modules.

The display 206 can be any mechanism that is operable to visually convey information to a user. For example, the display 206 may be a panel that includes light-emitting diodes (LEDs), organic LEDs, liquid crystal elements, or electrophoretic elements. In some embodiments, the display 206 is touch sensitive. Thus, a user may be able to provide input to the inspection platform 214 by interacting with the display 206.

The communication module 208 may be responsible for managing communications between the components of the computing device 200, or the communication module 208 may be responsible for managing communications with other computing devices (e.g., server system 108 of FIG. 1). The communication module 208 may be wireless communication circuitry that is designed to establish communication channels with other computing devices. Examples of wireless communication circuitry include integrated circuits (also referred to as "chips") configured for Bluetooth, Wi-Fi, NFC, and the like.

The image sensor 210 may be any electronic sensor that is able to detect and convey information in order to generate image data. Examples of image sensors include charge-coupled device (CCD) sensors and complementary metal-oxide semiconductor (CMOS) sensors. The image sensor 210 may be implemented in a camera module (or simply "camera") that is implemented in the computing device 200. In some embodiments, the image sensor 210 is one of multiple image sensors implemented in the computing device 200. For example, the image sensor 210 could be included in a front- or rear-facing camera on a mobile phone.

Other sensors may also be implemented in the computing device 200. Collectively, these sensors may be referred to as the "sensor suite" 212 of the computing device 200. For example, the computing device 200 may include a motion sensor whose output is indicative of motion of the computing device 200 as a whole. Examples of motion sensors include multi-axis accelerometers and gyroscopes. In some embodiments, the motion sensor is implemented in an inertial measurement unit (IMU) that measures the force, angular rate, or orientation of the computing device 200. The IMU may accomplish this through the use of one or more accelerometers, one or more gyroscopes, one or more magnetometers, or any combination thereof. As another example, the computing device 200 may include a proximity sensor whose output is indicative of proximity of the computing device 200 to a nearest obstruction within the field of view of the proximity sensor. A proximity sensor may include, for example, an emitter that is able to emit infrared (IR) light and a detector that is able to detect reflected IR light that is returned toward the proximity sensor. These types of proximity sensors are sometimes called laser imaging, detection, and ranging (LiDAR) scanners. As another example, the computing device 200 may include an ambient light sensor whose output is indicative of the amount of light in the ambient environment.

For convenience, the inspection platform 214 is referred to as a computer program that resides within the memory 204. However, the inspection platform 214 could be comprised of software, firmware, or hardware that is implemented in, or accessible to, the computing device 200. In accordance with embodiments described herein, the inspection platform 214 may include a processing module 216, coordinating module 218, locating module 220, and graphical user interface (GUI) module 222. Each of these modules can be an integral part of the inspection platform 214. Alternatively, these modules can be logically separate from the inspection platform 214 but operate "alongside" it. Together, these modules enable the inspection platform 214 to generate measurements of a physical space, as well as objects contained therein, in an automated manner by guiding a user through a measurement operation.

The processing module 216 can process data obtained by the inspection platform 214 into a format that is suitable for the other modules. For example, the processing module 216 may apply operations to images generated by the image sensor 210 in preparation for analysis by the other modules of the inspection platform 214. Thus, the processing module 216 may despeckle, denoise, or otherwise filter images that are generated by the image sensor 210. Additionally or alternatively, the processing module 216 may adjust properties like contrast, saturation, and gain in order to improve the outputs produced by the other modules of the inspection platform 214.

The processing module 216 may also proceed data obtained from the sensor suite 212 in preparation for analysis by the other modules of the inspection platform 214. As further discussed below, the inspection platform 214 may utilize data that is generated by a motion sensor in order to better understand data that is generated by the image sensor 210. For example, the inspection platform 214 may programmatically combine images generated by the image sensor 210 based on measurements generated by the motion sensor, so as to create a panorama of the physical space. Moreover, the inspection platform 214 may determine, based on the measurements, an approximate location of each image generated by the image sensor 210 and then use those insights to estimate dimensions of the physical space and objects contained therein. To accomplish this, the measurements generated by the motion sensor must be temporally aligned with the images generated by the image sensor 210. The processing module 216 may be responsible for ensuring that these data are temporally aligned with one another, such that the inspection platform 214 can readily identify the measurement(s) that correspond to each image.

The coordinating module 218 may be responsible for determining and/or cataloguing the locations of junctures. Assume, for example, that a user is interested in establishing the dimensions of a physical space. The periphery of the physical space may be defined by junctures, each of which represents a location where at which a pair of surfaces are joined. In order to "map" the periphery of the physical space, the inspection platform 214 may request that the user locate the computing device 200 in a certain position (e.g., proximate the center of the physical space) and then capture a panorama of the physical space by panning the computing device 200. The coordinating module 218 may be responsible for determining, based on an analysis of the panorama, where the junctures of the physical space are located. As further discussed below, this can be accomplished by applying a trained model to the panorama. The trained model may produce, as output, coordinates indicating where a juncture is believed to be located based on pixel-level examination of the panorama. Normally, the trained model will produce a series of outputs that are representative of different junctures of the physical space. Using the series of outputs, the coordinating module 218 can "reconstruct" the physical space, thereby establishing its dimensions. In some embodiments, outputs produced by the sensor suite 212 are used to facilitate the process. For example, a measurement produced by a motion sensor or proximity sensor may allow the coordinating module 218 to gain greater insight into where the computing device 200 is located in the physical space (and thus how to establish the dimensions).

The measuring module 220 can examine the locations of junctures determined by the coordinating module 218 in order to derive insights into the physical space. For example, the measuring module 220 may calculate a dimension of the physical space based on a comparison of multiple locations (e.g., a width defined by a pair of wall-wall boundaries, or a height defined by the floor-wall and ceiling-wall boundaries). As another example, the measuring module 220 may generate a 2D or 3D layout using the locations. Thus, the measuring module 220 may be able to construct a 2D or 3D model of the physical space based on insights gained through analysis of a single panorama. In some embodiments, the measuring module 220 is also responsible for cataloging the locations of junctures determined by the coordinating module 218. Thus, the measuring module 220 may store the locations in a data structure that is associated with either the physical space or a building with which the physical space is associated. Information derived by the measuring module 220, such as dimensions and layouts, can also be stored in the data structure. In some embodiments each location is represented using a coordinate system (e.g., a geographic coordinate system such as the Global Positioning System) that is associated with real-world positions, while in other embodiments each location is represented using a coordinate system that is associated with the surrounding environment. For example, the location of each juncture may be defined with respect to the location of the computing device 200.

The GUI module 222 may be responsible for generating interfaces that can be presented on the display 206. Various types of information can be presented on these interfaces. For example, information that is calculated, derived, or otherwise obtained by the coordinating module 218 and/or measuring module 220 may be presented on an interface for display to the user. As another example, visual feedback may be presented on an interface so as to indicate to the user whether the measurement procedure is being completed properly.

Other modules could also be included in the inspection platform 214. As further discussed below, the inspection platform 214 may not only be responsible for determining the dimensions of a physical space, but also identifying objects contained therein in some embodiments. In such embodiments, the inspection platform 214 may include a computer vision module that applies one or more types of computer vision models to a panorama provided as input, so as to identify one or more types of objects contained in the corresponding physical space. The computer vision models may include multi-class classification, object detection, semantic segmentation, or other deep learning based computer vision approaches to identify multiple types of objects (e.g., different brands of a single object, or different types of objects that are commonly found in the same physical space). The computer vision module may also combine several individual computer vision models together to improve accuracy of detection (e.g., apply an object detection model to identify and localize a specific object and then apply a classification model on the localized object to determine kind or quality). These computer vision models may be stored in the memory 204 of the computing device 200, or these computer vision models may be stored in a remote memory that is accessible to the computing device 200 (e.g., via the communication module 208).

Figure 3:
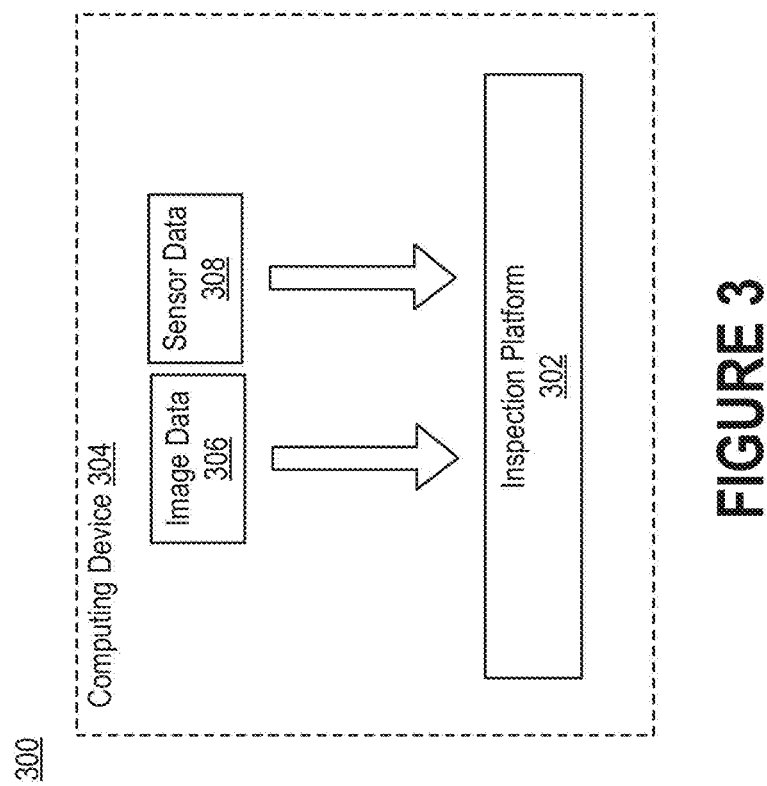
FIG. 3 depicts an example of a communication environment that includes an inspection platform implemented on a computing device.

FIG. 3 depicts an example of a communication environment 300 that includes an inspection platform 302 implemented on a computing device. As shown in FIG. 3, the inspection platform 302 may receive and then process several types of data. Here, for example, the inspection platform 302 receives image data 306 and sensor data 308.

These data are generally obtained from different sources. For example, the image data 306 may include images that are generated by an image sensor (e.g., image sensor 210 of FIG. 2) that is implemented in the computing device 304. These images may be discrete images that are captured in rapid succession by the image sensor, or these images may be the individual frames of a video feed that is produced by the image sensor. The sensor data 308 may be obtained from one or more of the sensors included in the sensor suite (e.g., sensor suite 212 of FIG. 2) of the computing device 304. For example, the sensor data 308 may include measurements that are generated by a motion sensor, such as an accelerometer or gyroscope, as the computing device 304 is used to generate the image data 306.

Methodologies for Automated Measurement Estimation

Figure 4:
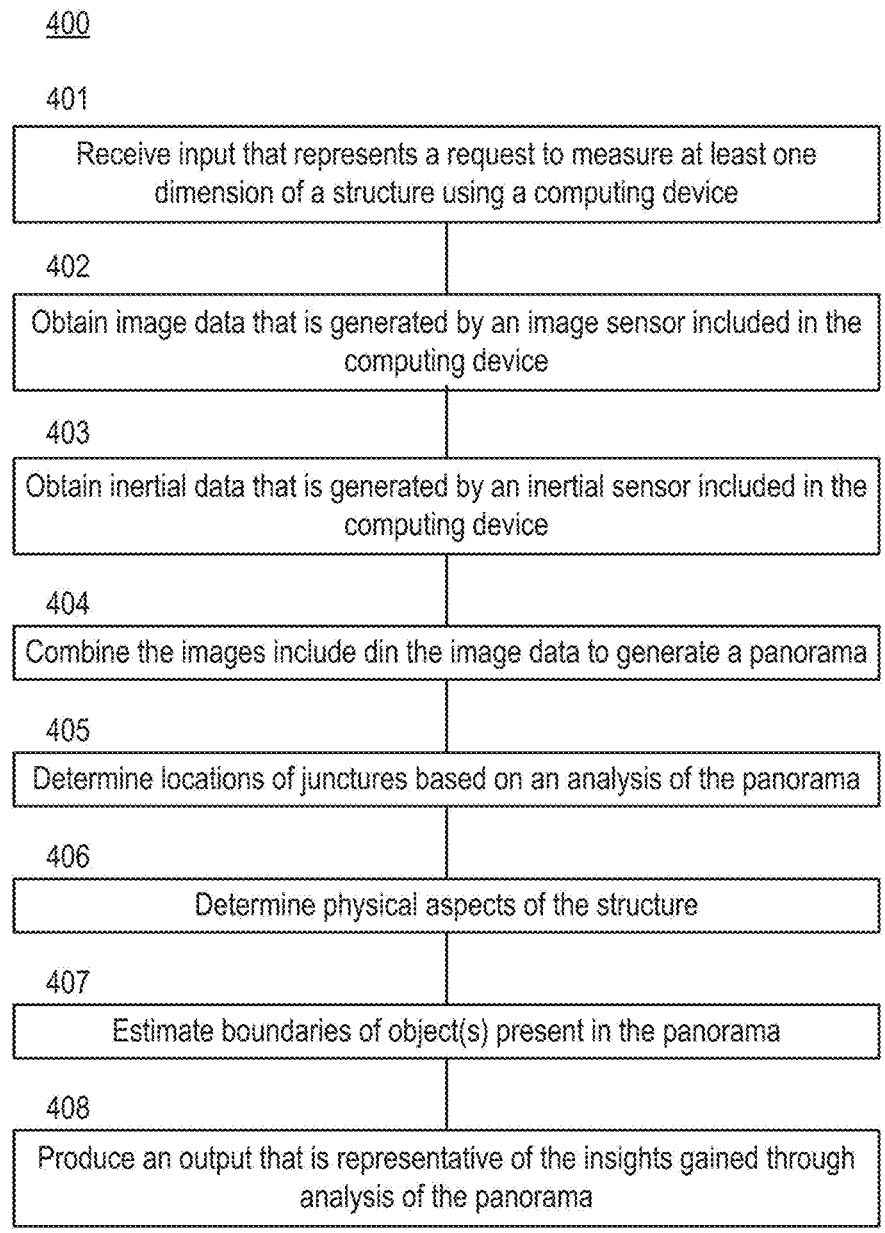
FIG. 4 includes a flow diagram of a process for automatically extracting measurements of a structure to enable measurement of arbitrary dimensions, angles, or square footage through analysis of image data and inertial data generated by a computing device.

FIG. 4 includes a flow diagram of a process 400 for automatically extracting measurements of a structure to enable measurement of arbitrary dimensions, angles, or square footage through analysis of image data and inertial data generated by a computing device. As an example, the process 400 could be used to establish the height, width, and depth of an interior space of a building, an exterior space of the building, or the building itself. Those skilled in art will recognize that the process 400 may be able for use in the insurance industry for assisting in tasks related to insurance claim processes and/or underwriting processes. However, the process 400 is not limited to the insurance industry, and thus could be utilized in any field or scenario where providing automated measurements of a structure is beneficial.

Initially, an inspection platform will receive input that represents a request to measure at least one dimension of a structure (step 401). Generally, the input is representative of a request to measure a portion of the structure, such as an interior space or exterior space. The input normally corresponds to a user either initiating (i.e., opening) the inspection platform or interacting with the inspection platform in such a manner so as to indicate that she is interested in measuring the structure. For example, the user may interact with a digital element labeled "Initiate Measuring" or "Begin Measuring" that is viewable on an interface generated by the inspection platform. Alternatively, this input could correspond to an instruction that is provided by either a server system to which the computing device is connected or the computing device itself. For example, the server system may transmit an instruction to initiate the measurement operation to the inspection platform responsive to a determination that certain conditions have been met, the user has indicated a willingness to complete the measurement operation, etc.

The inspection platform can then obtain image data that is generated by an image sensor included in the computing device (step 402). The image data may include images of at least a portion of the structure to be measured. These images may be representative of static images captured in rapid succession by the image sensor, or these images may be representative of the frames of a video captured by the image sensor. Preferably, the inspection platform may guide the user through capturing the image data at various points of rotation of the computing device to ensure collection of a full 360-degree lateral (i.e., left and right relative to the structure) space and 180-degree vertical (i.e., up and down relative to the structure) space.

Moreover, the inspection platform can obtain inertial data that is generated by an inertial sensor included in the computing device (step 403). As mentioned above, the term "inertial sensor" may be used interchangeably with the term "motion sensor." The nature of the inertial data will depend on the nature of the inertial sensor. For example, in embodiments where the inertial sensor is an IMU that includes one or more accelerometers, one or more gyroscopes, one or more magnetometers, or combinations thereof, the inertial data may include a discrete series of measurements in temporal order. Each measurement may indicate a characteristic of motion of the computing device. For example, the measurements may indicate rotational velocity and/or acceleration of the computing device over an interval of time corresponding to generation of the image data.

It is to be appreciated that the generation of image data and inertial data may be performed simultaneously by the computing device. As further discussed below, the temporal relationship between the image data and inertial data may allow the inspection platform to gain insights into the position of the computing device with respect to the structure.

The inspection platform can then combine, based on the inertial data, the different images included in the image data to create a panorama of at least a portion of the structure (step 404). For the purpose of illustration, the processes herein are described in the context of panoramas; however, those skilled in the art will recognize that the processes may be similarly applicable to images that are not wide-angle representations of a structure. As an example, the inspection platform may employ algorithms that are designed to combine or "stitch" the different images together so as to create an equirectangular projection of the structure. In some embodiments, the algorithms overcome the limitations of existing approaches by using line matching techniques in contrast to the feature matching techniques that are normally practiced by those existing approaches. At a high level, line matching techniques may allow the algorithms to optimally perform relative to the structures that are typically of interest (e.g., the interior spaces of buildings). In operation, the algorithms may estimate the focal length in a manner that is unique with respect to existing approaches. For example, through line matching, the algorithms may estimate the focal length of the image sensor associated with generation of the panorama and then further utilize the measurements included in the inertial data to determine an approximate location of each captured image relative to geography associated with the structure.

Thereafter, the inspection platform can determine the location of junctures of the structure (step 405), preferably utilizing the panorama of at least a portion of the structure. For example, the inspection platform may utilize the panorama to identify the locations of junctures that are representative of floor-wall, ceiling-wall, or wall-wall boundaries. Moreover, the inspection platform may utilize the panorama to compute, infer, or otherwise establish characteristics of other physical features of the structure. For example, the inspection platform may be able to determine the curvature of the surfaces—namely, the walls, ceilings, or floors—that make up the structure. Thus, in accordance with various embodiments, the algorithms executed by the inspection platform may preferably operate on the panorama to determine the locations of structural intersections like junctures. After determining the location of the junctures of the structure, the inspection platform can determine structural aspects (also referred to as "physical aspects") of the structure (step 406). For example, the inspection platform may determine the location of all walls, ceilings, and floors in a 3D spatial representation by combining its knowledge of juncture locations and surface curvature.

In some embodiments, the inspection platform is further configured to estimate the boundaries of some or all of the objects that are present in the panorama (step 407). When identifying the boundaries of objects contained in the panorama, the inspection platform may identify salient objects (e.g., fixtures, appliances, furniture, animals) that are present in the panorama. The boundaries of a given object could be identified, for example, by estimating the 3D dimensions of aspects present in the imaged portion of the structure and then using those aspects for reference. Preferably, the estimated dimensions (and measurements of aspects of the structure) are estimated to a scale factor for consistency purposes. The final scaled values may be regressed relative to the distance between the computing device and ground. Additionally or alternatively, the final scaled values may be regressed relative to the sizes of the salient objects identified in the panorama (and thus present in the structure). As part of the measurement operation, the inspection platform may also be configured to geographically label—a process referred to as "geo-tagging"—one or more aspects of the structure or the salient objects contained therein.

The inspection platform can then produce an output that is representative of the insights gained through analysis of the panorama (step 408). As an example, the inspection platform may generate a manipulable 3D image that is presented by the computing device for display to the user. The manipulable 3D image may depict user- or platform-selected dimensions estimated for the structure or the salient objects contained therein. Generally, the manipulable 3D image is generated by combining the determined physical aspects of the structure with the panorama, so as to enable the user to manipulate the 3D image relative to a selected viewing angle. Measurements determined by the inspection platform (e.g., through analysis of the panorama) can be overlaid on the manipulable 3D image, utilizing the estimated object boundaries that are present in the panorama image. To permit manipulation, the interface on which the 3D image is presented may be a "point-and-click interface" that is responsive to selections made by the user. For example, the user may be permitted to identify additional measurements to be generated by selecting one or more locations within the bounds of the 3D image. These location(s) may be associated with physical aspects of the structure, or these location(s) may be associated with a salient object contained in the structure.

In some embodiments, the inspection platform generates and then provides an overlay on the manipulable 3D image that is meant to controllably guide the user through the image data capture process. Additionally or alternatively, visual indicia may be provided on the interface to indicate determined structural damage relating to physical aspects of the structure. Assume, for example, that in the process of determining the physical aspects of the structure as discussed above with reference to step 406, the inspection platform discovers that a given physical aspect is abnormal in appearance. This can be accomplished by determining (e.g., based on an output produced by a computer vision model) that the given physical aspect is dissimilar from other physical aspects of the same type. This abnormality may be indicative of damage to the given physical aspect. In such a situation, a visual indicium (e.g., a bounding box or digital element in a certain color) may be provided on the interface to identify the abnormality. This can be done by the inspection platform to visually identify the risks, hazards, features, or material types that are associated with internal and external spaces. Examples of risks and hazards for interior spaces include exposed wires, presence of animals, issues related to water heaters, presence or absence of non-combustible materials, wood-burning stoves, issues related to plumbing, mold, water damage (e.g., stains), issues related to washing machines, presence or absence of vacant rooms, issues related to electrical components, and the like. Examples of risks and hazards for exterior spaces include presence of a deck, steps, stairs, porch, or railings, presence of a pool or pool-related features and components, presence of yard-related features and components, presence of propane task, presence of natural features (e.g., lakes, ponds, or streams) in proximity to a structure, condition of exterior portion of a structure, signage associated with a structure, presence of cages or enclosures for animals, presence of boarded ingress points (e.g., doors and windows), presence of clutter or debris, type of structure (e.g., whether the structure is a mobile or modular home), presence of tarps (e.g., on the roof), presence of bars (e.g., on the doors or windows), and the like.

Note that the types of objects contained in a structure will normally depend on the nature of the structure. If, for example, the imaged portion of the structure is an interior space, then the panorama may be of a bathroom with corresponding fixtures, a kitchen with corresponding fixtures, a laundry room with corresponding fixtures, a common area with associated fixtures, a utility closet with associated fixtures, etc. Meanwhile, if the imaged portion of the structure is an exterior space, then the panorama may be of the construction materials used for exterior construction, outbuildings (e.g., garages and playscapes), yard components (e.g., water features and garden features), exterior components (e.g., faucets, gutters, and condensate drain lines), etc.

FIG. 5 includes a flow diagram of a process 500 for facilitating a guided procedure for modeling an interior space of a structure using an inspection platform that is executing on a computing device. While the process 500 is described in the context of an interior space, those skilled in the art will recognize that aspects of the process 500 may be similarly appliable to modeling an exterior space. Initially, the inspection platform will receive input that is indicative of a request to establish the layout of an interior space that includes a series of junctures, each of which represents a point at which a different pair of surfaces are joined (step 501). Step 501 of FIG. 5 may be substantially similar to step 401 of FIG. 4.

In some embodiments, a user may be able to indicate whether she is interested in establishing a 2D or 3D layout of the interior space. If the user is interested in establishing a 2D layout of the interior space, the inspection platform may only catalogue, store, or otherwise record information regarding wall-wall boundaries. Conversely, if the user is interested in establishing a 3D layout of the interior space, the inspection platform may catalogue, store, or otherwise record information regarding floor-wall, ceiling-wall, and wall-wall boundaries.

The inspection platform can then instruct the user to generate a panorama by panning the computing device while an image sensor generates one or more images of the interior space (step 502). To generate a panorama, the computing device will normally generate at least two images of the interior space and then combine or "stitch" those images together to create the panorama. Accordingly, the panorama may be representative of multiple images with overlapping portions that are joined together—usually by the operating system of the computing device—to collectively represent the interior space.

Then, the inspection platform can apply a trained model to the panorama to produce an output that is representative of a juncture predicted by the trained model based on an analysis of the panorama (step 503). Further information regarding models that are trained to identify junctures can be found in U.S. application Ser. No. 17/401,912, titled "Semi-Supervised 3D Indoor Layout Estimation from a Single 360 Degree Panorama," which is incorporated by reference herein in its entirety. The trained model may output a matrix in which each entry indicates whether the corresponding pixel corresponds to a juncture. If an entry indicates that the corresponding pixel does correspond to a juncture, the value may also indicate the type of juncture (e.g., whether the juncture is representative of a floor-wall, ceiling-wall, or wall-wall boundary). With these values, the inspection platform may be able to define the juncture in the context of the panorama, for example, by identifying which pixels correspond to the juncture.

Figure 6:
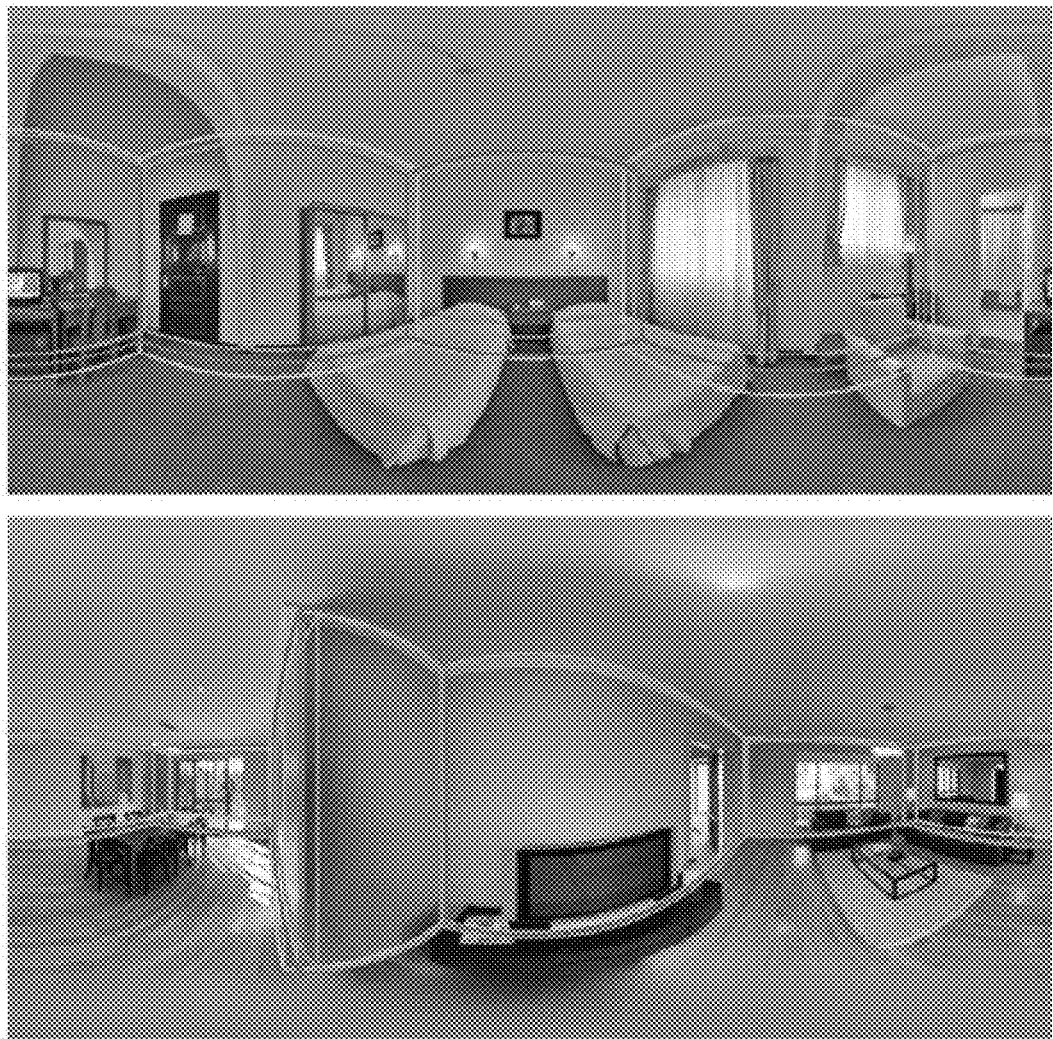
FIG. 6 illustrates how each juncture may be represented using a line that overlays a panorama image (or simply "panorama").

Moreover, the inspection platform may cause display of at least a portion of the panorama with a graphical element overlaid thereon to indicate a location of the juncture that is predicted by the trained model (step 504). Normally, the output is one of a series of outputs produced by the trained model, each of which is representative of a separate juncture that is predicted by the trained model based on an analysis of the panorama. Accordingly, while each juncture may be represented using a line that overlays the panorama, the panorama may have one or more bounding boxes overlaid thereon as shown in FIG. 6. Each bounding box may have four sides, namely, a first side that is representative of the floor-wall boundary, a second side that is representative of the ceiling-wall boundary, and third and fourth sides that are representative of wall-wall boundaries. In a spatial sense, the first and second sides are normally roughly parallel to one another and roughly orthogonal to the third and fourth sides. However, the bounding box may not be rectangular due to the distortion of the panorama. As can be seen in FIG. 6, the bounding boxes that define the walls of an interior space tend to "bulge" along at least one side.

Graphical elements may be overlaid on the panorama after the panorama has been fully captured, or graphical elements may be overlaid on the panorama as the panorama is being captured. For example, while the user pans the computing device so that the periphery of the interior space can be viewed by the image sensor, the panorama may be shown on the display. In such embodiments, the inspection platform may apply the trained model to the panorama in real time (e.g., to columns of pixels) and then populate graphical elements as appropriate.

The inspection platform may also be able to establish the layout of the interior space based on the outputs produced by the trained model (step 505). As mentioned above, the outputs may be representative of junctures that are predicted by the trained model based on an analysis of the panorama. For each juncture, the inspection platform may infer, predict, or otherwise establish a spatial position in the context of a coordinate system (e.g., defined with respect to the interior space). With these spatial positions, the inspection platform can determine the layout of the interior space. Thereafter, the inspection platform may encode information regarding the layout in a data structure that is associated with the interior space (step 506). For example, the inspection platform may encode the spatial positions of the junctures, the dimensions of the walls, the height of the ceiling, etc. The data structure is normally stored in a memory that is internal to the computing device on which the inspection platform is executing. However, the inspection platform could alternatively or additionally cause transmission of the data structure to a destination external to the computing device (step 507). For example, the data structure could be transmitted to another computing device (e.g., server system 108 of FIG. 1) to which the computing device is communicatively connected.

Figure 7:
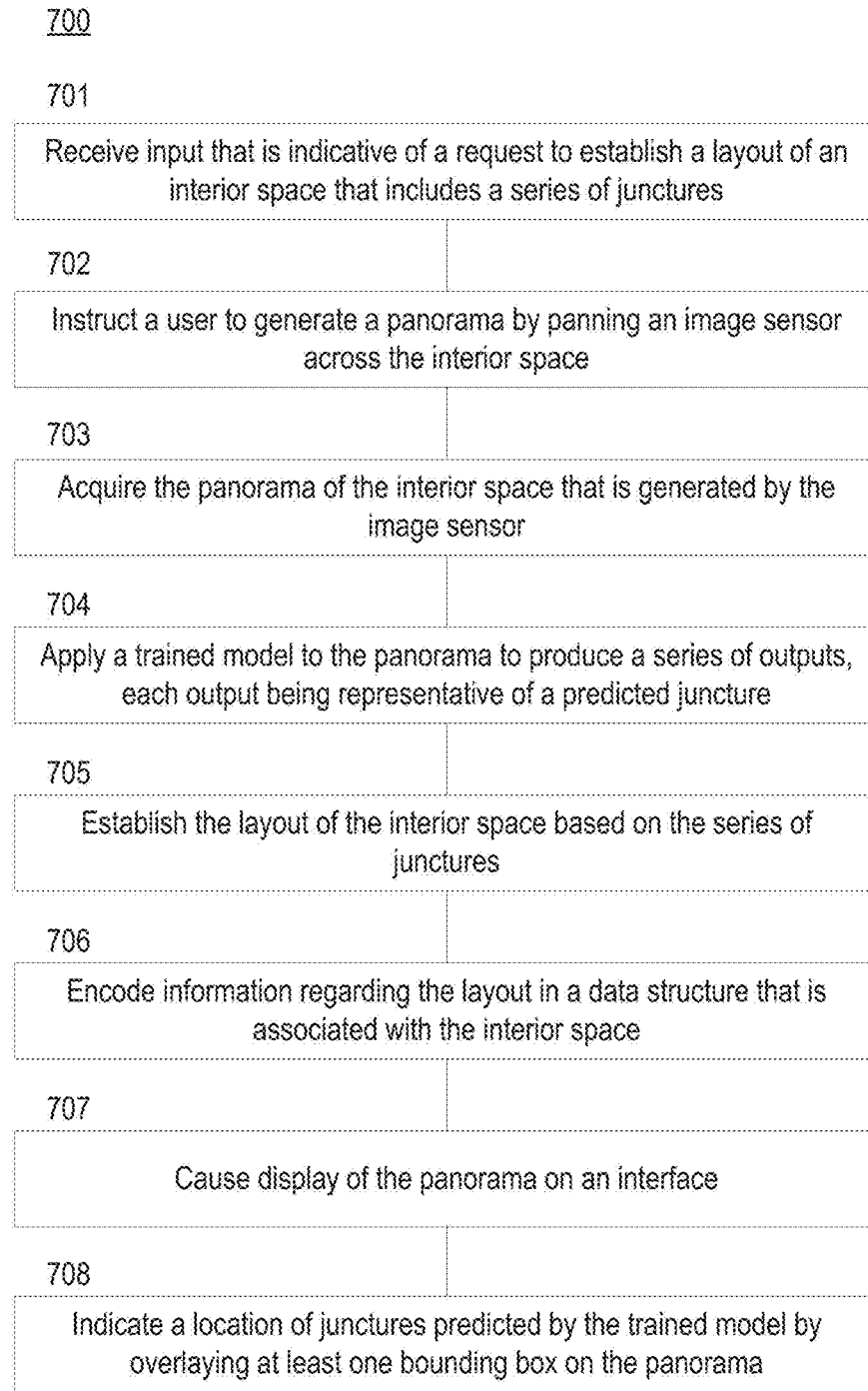
FIG. 7 includes a flow diagram of another process for facilitating a guided procedure for modeling an interior space using an inspection platform that is executing on a computing device.

FIG. 7 includes a flow diagram of another process 700 for facilitating a guided procedure for modeling an interior space using an inspection platform that is executing on a computing device. Again, while the process 700 is described in the context of an interior space, aspects of the process 700 may be similarly applicable to modeling an exterior space. Initially, the inspection platform may receive input that is indicative of a request from a user to establish the layout of an interior space that includes a series of junctures (step 701), each of which represents a point at which a different pair of surfaces are joined. Consider, for example, a rectangular room with four 90-degree corners. This rectangular room comprises various junctures of different types. There are four wall-wall boundaries at which different pairs of walls join together. Along each wall, there is also a floor-wall boundary and a ceiling-wall boundary. Together, these various junctures define the periphery of the interior space from a 3D perspective.

Thereafter, the inspection platform may instruct the user to generate a panorama by panning an image sensor across the interior space (step 702). This can be accomplished using the camera housed in a computing device that is associated with the user. In some embodiments the inspection platform resides on the computing device, while in other embodiments the inspection platform resides on another computing device to which the computing device is communicatively connected. In embodiments where the inspection platform resides on the computing device associated with the user, the inspection platform may configure a capture session so that the panorama is made available by the operating system after being generated by the camera. For instance, the inspection platform may cause the capture session to be customized by configuring a capture parameter of the camera based on a characteristic of the interior space. As an example, the resolution, focus, or flash could be altered based on the ambient light level, distance to wall, location in interior space, etc. These characteristics of the interior space may be determined based on an output produced by a sensor included in a sensor suite (e.g., sensor suite 212 of FIG. 2) of the computing device.

The inspection platform can then acquire the panorama of the interior space that is generated by the image sensor (step 703). In embodiments where the inspection platform resides on the computing device that was used to capture the panorama, the inspection platform may obtain the panorama directly from the operating system. Alternatively, the inspection platform may receive the panorama from across a network (e.g., via communication module 208 of FIG. 2). Thereafter, the inspection platform can apply a trained model to the panorama to produce a series of outputs (step 704). Each output in the series of outputs may be representative of a juncture that is predicted by the trained model based on an analysis of the panorama. The trained model may be configured to perform pixel-wise classification of pixel data corresponding to the panorama in a columnar manner to produce the series of outputs.

In some embodiments, the inspection platform establishes the layout of the interior space based on the series of outputs (step 705). For example, the inspection platform may calculate the dimensions of the interior space based on the series of outputs and then create a 2D floor plan for the interior space that is based on the dimensions. As another example, the inspection platform may calculate the dimensions of the interior space based on the series of outputs and then create a 3D floor plan for the interior space that is based on the dimensions. Whether the floor plan is 2D or 3D may depend on the type(s) of junctures that are predicted by the inspection platform. Moreover, the inspection platform can encode information regarding the layout in a data structure that is associated with the interior space (step 706). Step 706 of FIG. 7 may be substantially similar to step 506 of FIG. 5.

In some embodiments, the inspection platform is configured to provide feedback to the user during the capture session in which the panorama is captured. For example, the inspection platform may cause display of the panorama on an interface (step 707) and then indicate a location of each juncture that is predicted by the trained model by overlaying at least one bounding box on the panorama (step 708). As shown in FIG. 6, the perimeter of each bounding box is typically defined by a set of four outputs. Normally, the set of four outputs includes a first output representing a floor-wall boundary, a second output representing a ceiling-wall boundary, and third and fourth outputs representing different wall-wall boundaries. In some embodiments, steps 707-708 are performed in near real time. Thus, bounding boxes may be overlaid on the panorama as the image sensor is panned across the interior space (and the panorama is presented on the display of the computing device). In other embodiments, steps 707-708 are performed after the panorama is generated. For example, steps 707-708 may be performed by the inspection platform in response to receiving input indicative of a selection of the panorama by the user.

Figure 8:
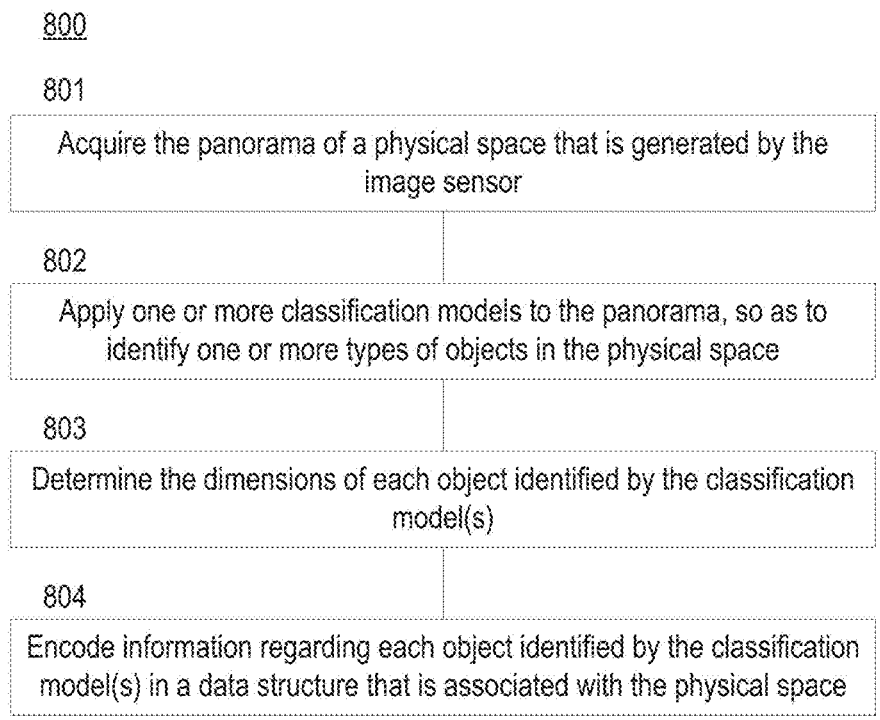
FIG. 8 includes a flow diagram of a process for identifying objects that are contained in a physical space for which a panorama is available.

FIG. 8 includes a flow diagram of a process 800 for identifying objects that are contained in a physical space for which a panorama is available. This physical space could be an interior space or exterior space. In some embodiments objects are identifying by applying computer vision models directly to the panorama, while in other embodiments the panorama is projected back into a normal perspective image before the computer vision models are applied. Additionally or alternatively, computer vision models may be applied to some or all of the images that collectively form the panorama.

Initially, an inspection platform can acquire a panorama of the physical space that is generated by an image sensor of a computing device (step 801). As discussed above with reference to FIGS. 4-5 and 7, the panorama is normally generated as part of a measurement operation in which a user pans the image sensor across the physical space. For example, the user may be guided by the inspection platform to systematically pan the image sensor across a portion of the physical space (e.g., so as to image lateral space in 360 degrees), or the user may be guided by the inspection platform to systematically pan the image sensor across the entire physical space (e.g., so as to image lateral space in 360 degrees and vertical space in 360 degrees).

Thereafter, the inspection platform may apply one or more classification models to the panorama (step 802), so as to identify one or more types of objects included in the panorama. Each classification model may be designed and then trained to identify a different type of object. For example, the classification models may include a first classification model that is trained to identify stoves, a second classification model that is trained to identify water heaters, a third classification model that is trained to identify water stains, etc. Accordingly, the classification models may be trained to identify objects that are associated with some degree of risk, as well as visual indicia of damage caused by those objects.

The classification models that are applied to the panorama may depend on the nature of the physical space. Assume, for example, that a user specifies that she is interested in generating a panorama of a kitchen and then proceeds to image the kitchen as discussed above. In such a situation, the inspection platform may only apply those classification models that have been deemed suitable or appropriate for kitchens. As an example, the inspection platform may apply classification models associated with stoves, refrigerators, and water stains but not washing machines or porches. This may advantageously allow the inspection platform to conserve computational resources since not every classification model is necessarily applied to every panorama obtained by the inspection platform.

To determine which classification models, if any, are appropriate for a given physical space, the inspection platform may access a data structure in which each classification model is programmatically associated with one or more types of physical spaces. For example, the classification model trained to identify stoves may be labelled as appropriate for kitchens, while the classification model trained to identify water stains may be labelled as appropriate for kitchens, bathrooms, bedrooms, and exterior spaces. These relationships may be manually defined (e.g., at the time of training), or these relationships may be automatically determined by the inspection platform (e.g., based on an analysis of a pool of panoramas to which each classification model available to the inspection platform may be applied).

Much like the trained model discussed above with reference to FIGS. 5 and 7, each classification model may produce, as output, a bounding box or pixel-wise classification that defines the pixels determined to represent an instance of the corresponding type of object. For a given panorama, the inspection platform may obtain several bounding boxes that are associated with different types of objects. For example, in the event that the panorama is associated with a kitchen, the inspection platform may ultimately obtain a first bounding box that identifies the stove, a second bounding box that identifies the refrigerator, a third bounding box that identifies a water stain, etc.

In some embodiments, the inspection platform is also configured to determine the dimensions of each object identified by a classification model based on analysis of the panorama (step 803). As an example, for a given object, the inspection platform may identify its boundaries based on the output produced by the classification model and then compute, infer, or otherwise establish its dimensions based on the boundaries. The dimensions could be determined in an absolute sense (e.g., based solely on analysis of its boundaries), or the dimensions could be determined in a relative sense (e.g., by considering its boundaries in the context of junctures of the physical space, other objects in the physical space, etc.).

The inspection platform can encode information regarding the outputs, if any, produced by the classification model (s) in a data structure that is associated with the physical space (step 804). Step 804 of FIG. 8 may be substantially similar to steps 506 and 706 of FIGS. 5 and 7, respectively, except that the information pertains to an object rather than the physical space. For example, the inspection platform may encode the dimensions of the object in the data structure. Additionally or alternatively, the inspection platform may encode the boundaries of the bounding box (e.g., in terms of pixel coordinates of the panorama) determined for the object.

Note that while the sequences of the steps performed in the processes described herein are exemplary, the steps can be performed in various sequences and combinations. For example, steps could be added to, or removed from, these processes. Similarly, steps could be replaced or reordered. Thus, the descriptions of these processes are intended to be open ended.

Additional steps may also be included in some embodiments.

For example, when a trained model is applied to a panorama as discussed above with reference to FIGS. 5 and 7, outputs will be produced that are representative of predicted locations of junctures. However, these predicted locations may be slightly inaccurate depending on the location of the computing device used to capture the panorama, as well as other factors such as lighting, resolution, etc. The inspection platform may attempt to limit the inaccuracy by adjusting the predicted locations. For instance, the inspection platform can be configured to mathematically model the spatial locations of individual junctures (and between pairs of junctures) based on the panorama and/or outputs generated by other sensors included in the computing device.

As another example, when a classification model is applied to a panorama as discussed above with reference to FIG. 8, an output may be produced that identifies an instance of a given type of object. In such a scenario, information regarding the object may be presented on an interface for review by the user. Thus, the user may be able to confirm or deny the instance of the object as identified by the classification model. Additionally or alternatively, the inspection platform may be able to prompt or permit the user to provide information regarding the instance of the object. Assume, for example, that the inspection platform applies, to a panorama, a classification model that identifies an instance of a stove. In this situation, the inspection platform may proactively ask the user to provide additional information regarding the stove (e.g., fuel type and age).

Processing System

Figure 9:
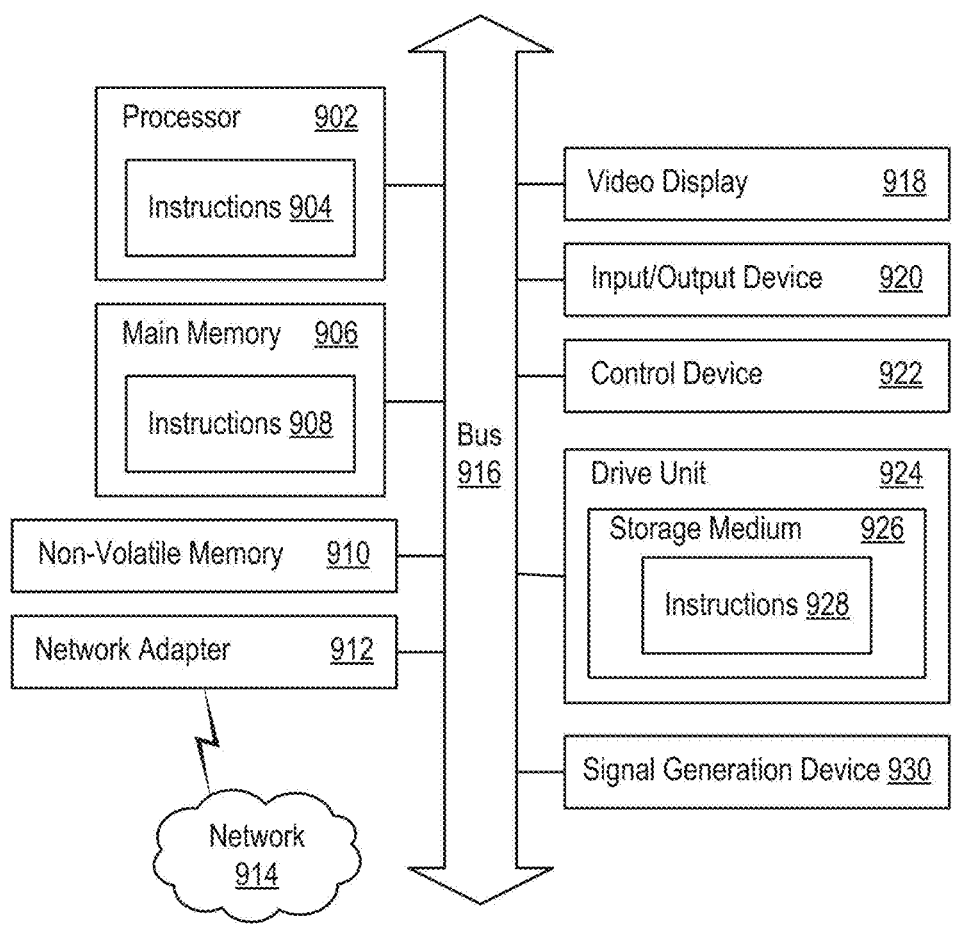
FIG. 9 is a block diagram illustrating an example of a processing system in which at least some operations described herein can be implemented.

FIG. 9 is a block diagram illustrating an example of a processing system 900 in which at least some operations described herein can be implemented. For example, components of the processing system 900 may be hosted on a computing device that includes an inspection platform, or components of the processing system 900 may be hosted on a computing device with which a panorama of a physical space is captured.

The processing system 900 may include a central processing unit ("processor") 902, main memory 906, non-volatile memory 910, network adapter 912, video display 918, input/output devices 920, control device 922 (e.g., a keyboard or pointing device), drive unit 924 including a storage medium 926, and signal generation device 930 that are communicatively connected to a bus 916. The bus 916 is illustrated as an abstraction that represents one or more physical buses or point-to-point connections that are connected by appropriate bridges, adapters, or controllers. The bus 916, therefore, can include a system bus, a Peripheral Component Interconnect (PCI) bus or PCI-Express bus, a HyperTransport or industry standard architecture (ISA) bus, a small computer system interface (SCSI) bus, a universal serial bus (USB), inter-integrated circuit ($I^2C$) bus, or an Institute of Electrical and Electronics Engineers (IEEE) standard 1394 bus (also referred to as "Firewire").

While the main memory 906, non-volatile memory 910, and storage medium 926 are shown to be a single medium, the terms "machine-readable medium" and "storage medium" should be taken to include a single medium or multiple media (e.g., a centralized/distributed database and/or associated caches and servers) that store one or more sets of instructions 928. The terms "machine-readable medium" and "storage medium" shall also be taken to include any medium that is capable of storing, encoding, or carrying a set of instructions for execution by the processing system 900.

In general, the routines executed to implement the embodiments of the disclosure may be implemented as part of an operating system or a specific application, component, program, object, module, or sequence of instructions (collectively referred to as "computer programs"). The computer programs typically comprise one or more instructions (e.g., instructions 904, 908, 928) set at various times in various memory and storage devices in a computing device. When read and executed by the processors 902, the instruction(s) cause the processing system 900 to perform operations to execute elements involving the various aspects of the present disclosure.

Further examples of machine- and computer-readable media include recordable-type media, such as volatile memory devices and non-volatile memory devices 910, removable disks, hard disk drives, and optical disks (e.g., Compact Disk Read-Only Memory (CD-ROMS) and Digital Versatile Disks (DVDs)), and transmission-type media, such as digital and analog communication links.

The network adapter 912 enables the processing system 900 to mediate data in a network 914 with an entity that is external to the processing system 900 through any communication protocol supported by the processing system 900 and the external entity. The network adapter 912 can include a network adaptor card, a wireless network interface card, a router, an access point, a wireless router, a switch, a multilayer switch, a protocol converter, a gateway, a bridge, bridge router, a hub, a digital media receiver, a repeater, or any combination thereof.

REMARKS

The foregoing description of various embodiments of the claimed subject matter has been provided for the purposes of illustration and description. It is not intended to be exhaustive or to limit the claimed subject matter to the precise forms disclosed. Many modifications and variations will be apparent to one skilled in the art. Embodiments were chosen and described in order to best describe the principles of the invention and its practical applications, thereby enabling those skilled in the relevant art to understand the claimed subject matter, the various embodiments, and the various modifications that are suited to the particular uses contemplated.

Although the Detailed Description describes certain embodiments and the best mode contemplated, the technology can be practiced in many ways no matter how detailed the Detailed Description appears. Embodiments may vary considerably in their implementation details, while still being encompassed by the specification. Particular terminology used when describing certain features or aspects of various embodiments should not be taken to imply that the terminology is being redefined herein to be restricted to any specific characteristics, features, or aspects of the technology with which that terminology is associated. In general, the terms used in the following claims should not be construed to limit the technology to the specific embodiments disclosed in the specification, unless those terms are explicitly defined herein. Accordingly, the actual scope of the technology encompasses not only the disclosed embodiments, but also all equivalent ways of practicing or implementing the embodiments.

The language used in the specification has been principally selected for readability and instructional purposes. It may not have been selected to delineate or circumscribe the subject matter. It is therefore intended that the scope of the technology be limited not by this Detailed Description, but rather by any claims that issue on an application based hereon. Accordingly, the disclosure of various embodiments is intended to be illustrative, but not limiting, of the scope of the technology as set forth in the following claims.

What is claimed is:

1. A non-transitory medium with instructions stored thereon that, when executed by a processor of a computing device, cause the computing device to perform operations comprising:
   receiving input that is indicative of a request to establish a layout of an interior space that includes a series of junctures, each of which represents a point at which a different pair of vertically planar surfaces are joined;
   instructing a user to generate a panorama image by panning a camera across the interior space, so as to image the interior space in 360 degrees along a horizontal plane;
   causing a capture session to be customized by configuring a capture parameter of the camera, wherein the capture parameter comprises camera resolution, focus, and flash;
   acquiring, by the camera, inertial data and the panorama image of the interior space, according to the customized capture session;
   generating an equirectangular panorama image by temporally aligning the inertial data with image data associated with the panorama image;
   applying a trained model to the equirectangular panorama image to produce a series of outputs, wherein each output in the series of outputs is representative of a corresponding juncture that is predicted by the trained model based on an analysis of the equirectangular panorama image;
   applying one or more trained classification models to the equirectangular panorama image to generate visual indicia to indicate an abnormal appearance of a structure in the interior space;
   wherein the abnormal appearance of the structure comprises one or more risks or hazards;
   establishing the layout of the interior space based on the series of outputs by:
      predicting, for each output in the series of outputs, a spatial position of the corresponding juncture in a context of a coordinate system, and calculating dimensions of the interior space based on the spatial positions predicted for the series of outputs; and
   encoding information regarding the layout in a data structure that is associated with the interior space.

2. The non-transitory medium of claim 1, wherein each juncture in the series of junctures represents a wall-wall boundary at which a pair of walls join.

3. The non-transitory medium of claim 1, wherein the camera is contained in the computing device, and wherein the operations further comprise:
   in response to receiving the input, configuring a capture session so that one or more of the panorama image and the equirectangular panorama image is made available by an operating system of the computing device after being generated by the camera.

4. The non-transitory medium of claim 3, wherein the panorama image is representative of a series of frames with overlapping portions that are joined together by the operating system of the computing device to collectively represent the interior space.

5. The non-transitory medium of claim 1, wherein said establishing further comprises:

creating a three-dimensional (3D) floor plan for the interior space that is based on the dimensions.

6. The non-transitory medium of claim 1, wherein the trained model performs pixel-wise classification of pixel data corresponding to one or more of the panorama image and the equirectangular panorama image in a columnar matter to produce the series of outputs.

7. A method implemented by a computer program executing on a computing device, the method comprising:
receiving input that is indicative of a request to establish a layout of an interior space that includes a series of junctures, each of which represents a point at which a different pair of surfaces are joined;
instructing a user to generate a panorama image by a camera around the interior space;
causing a capture session to be customized by configuring a capture parameter of the camera, wherein the capture parameter comprises camera resolution;
acquiring, by the camera, inertial data and at least two images of the interior space according to the capture parameter;
generating an equirectangular panorama image by temporally aligning the inertial data with the at least two images;
applying a trained model to the equirectangular panorama image to produce a series of outputs, wherein each output in the series of outputs is representative of a separate juncture predicted by the trained model based on an analysis of the equirectangular panorama image;
applying one or more trained classification models to the equirectangular panorama image to generate visual indicia to indicate an abnormal appearance of a structure in the interior space;
wherein the abnormal appearance of the structure comprises one or more risks or hazards; and
causing display of at least a portion of the equirectangular panorama image with graphical elements overlaid thereon in a form of a bounding box, wherein a perimeter of the bounding box is defined by a set of four outputs, the four outputs being a subset of the series of outputs, and wherein the set of four outputs includes a first output representing a floor-wall boundary, a second output representing a ceiling-wall boundary, and third and fourth outputs representing different wall-wall boundaries.

8. The method of claim 7, wherein the method further comprises:
establishing the layout of the interior space based on the series of outputs;
encoding information regarding the layout in a data structure that is associated with the interior space; and
causing transmission of the data structure to a destination external to the computing device.

9. The method of claim 7, wherein acquiring the inertial data comprises acquiring a series of measurements that are generated by a motion sensor of the camera contemporaneously with the acquiring of the at least two images;
wherein the equirectangular panorama image is generated by combining the at least two images based on the series of measurements.

10. A method implemented by a computer program executing on a computing device, the method comprising:
causing a capture session to be customized by configuring a capture parameter of a camera, wherein the capture parameter comprises a flash setting;
acquiring, by a camera, inertial data and two or more images of a physical space according to the capture parameter for which a dimension is to be determined;
generating an equirectangular panorama image by temporally aligning the inertial data with image data associated with the two or more images;
applying a model to the two or more images to produce a series of outputs, wherein each output in the series of outputs is representative of a corresponding juncture that is predicted by the model;
applying one or more trained classification models to the equirectangular panorama image to generate visual indicia to indicate an abnormal appearance of a structure in the interior space;
wherein the abnormal appearance of the structure comprises one or more risks or hazards;
determining the dimension of the physical space based on an analysis by:
predicting, for each output in the series of outputs, a spatial position of the corresponding juncture in a context of a coordinate system, and calculating the dimension of the physical space based on the spatial positions predicted for the series of outputs; and
encoding the dimension in a data structure that is associated with the physical space.

11. The method of claim 10, further comprising:
applying a second model to the two or more images to produce an output that is representative of an object that is predicted by the second model.

12. The method of claim 10, further comprising applying a second model to the equirectangular panorama image to produce an output representative of a bounding box or pixel-wise classification that includes pixels of two or more images that correspond to an object.

13. The method of claim 11, wherein the second model is one of a series of models that are applied to the equirectangular panorama image for object classification purposes, and wherein each model in the series of models is trained to predict a different type of object.

14. The method of claim 11, further comprising:
encoding information regarding the object in the data structure that is associated with the physical space.

15. The method of claim 10, further comprising:
estimating, based on the two or more images, focal lengths needed to generate the equirectangular panorama image;
determining, based on a series of measurements, a location of each of the two or more images relative to a geography of the physical space; and
combining the two or more images based on the location.

16. The method of claim 10, further comprising:
causing display of the equirectangular panorama image on an interface; and
indicating a location of each juncture that is predicted by the model by overlaying at least one bounding box on the equirectangular panorama image, wherein a perimeter of the bounding box is defined by a set of four outputs, and wherein the set of four outputs includes a first output representing a floor-wall boundary, a second output representing a ceiling-wall boundary, and third and fourth outputs representing different wall-wall boundaries.

17. The method of claim 16, wherein said causing and said indicating are performed in near real time as a camera of the computing device is panned across the physical space to generate the equirectangular panorama image.

* * * * *